US006606332B1

United States Patent
Boscha (10) Patent No.: US 6,606,332 B1
(45) Date of Patent: Aug. 12, 2003

(54) METHOD AND APPARATUS OF COLOR MIXING IN A LASER DIODE SYSTEM

(76) Inventor: Bogie Boscha, 101 Hillside Ave., Metuchen, NJ (US) 08840

(*) Notice: Subject to any disclaimer, the term of this patent is extended or adjusted under 35 U.S.C. 154(b) by 25 days.

(21) Appl. No.: 09/702,605

(22) Filed: Nov. 1, 2000

(51) Int. Cl.⁷ .................................................. H01S 3/16
(52) U.S. Cl. ............................... 372/42; 372/9; 372/31; 348/750
(58) Field of Search ................................ 372/42, 31, 9; 348/750

(56) References Cited

U.S. PATENT DOCUMENTS

| 5,019,769 A | * | 5/1991 | Levinson ..................... 372/31 |
| 5,614,961 A | * | 3/1997 | Gibeau et al. ............... 348/750 |
| 5,715,021 A | | 2/1998 | Gibeau et al. |
| 5,802,222 A | | 9/1998 | Rasch et al. |
| 5,832,155 A | | 11/1998 | Rasch et al. |
| 5,920,361 A | * | 7/1999 | Gibeau et al. ............... 348/750 |
| 6,233,025 B1 | * | 5/2001 | Wallenstein ................ 348/750 |
| 6,377,592 B1 | * | 4/2002 | Auracher et al. ............. 372/9 |

* cited by examiner

Primary Examiner—Paul Ip
Assistant Examiner—Tuan Nguyen
(74) Attorney, Agent, or Firm—I. Zborovsky (57) ABSTRACT

A color mixing system is proposed for use in an optical-fiber laser-diode assembly comprising at least two semiconductor laser diodes, optical fiber light input and output couples, a system of spatial superposition of laser beams of different wavelength with at least one semi-transparent mirror, and a system for electronic control of light power in monochromatic light components to be mixed. The electronic control system makes it possible to produce a plurality of different colors. The basic colors, i.e., blue, green, and red, are produced by respective laser diode assemblies provided with means for adjusting output light power on each individual assembly. The electronic system contains a microprocessor connected to a pulse width modulation unit capable of modulating the duration and shape of the light pulse emitted from the laser diode. This allows for selecting a required ratio of energetic brightnesses of light beams produced by individual laser diode assemblies. The electronic system contains a microprocessor connected to a pulse width modulation unit capable of modulating the duration of the light pulse emitted from the laser diode for controlling chromaticity of the color and to a current source for controlling the luminescence, i.e., the light power. The aforementioned control of chromaticity and light power is carried out simultaneously in real time with reproduction of perfect colors based on the use of single-mode pure stabilized and frequency double wavelengths with narrow linewidths of the light spectra.

31 Claims, 4 Drawing Sheets

METHOD AND APPARATUS OF COLOR MIXING IN A LASER DIODE SYSTEM

FIELD OF THE INVENTION

The present invention relates to color mixing, in particular to color-image formation in an optical fiber laser system for use in display units, virtual displays, laser printing, laser TV, laser lithography, scanning, etc.

BACKGROUND OF THE INVENTION

For better understanding the principle of the invention, it would be advantageous to briefly describe some fundamentals of color mixing in an image-formation process. It is well known that perception of colors by a human eye is a complicated physiological process, which involves participation of an optical system of an eye and our brain. In other words, color is the external factor, a sensation existing only in our minds.

The remarkable repertoire of color effects seen by the eye, and interpreted by the brain, is our response to certain wavelengths of electromagnetic energy that makes up the visible spectrum of light. While we are able to measure quite accurately the wavelengths of light, our response to those wavelengths is affected by a whole multitude of factors that are beyond the scope of our invention. What is important to note is that, when we observe a non-self-luminescent object, i.e., an object illuminated by an external light source, the color perception of an eye from the light reflected from this object will depend essentially only on the spectral composition of the light that illuminates this object. Thus, a color is a property of spectral characteristics of light radiation common for the entire radiation spectrum, irrespective of visible or invisible. Generally speaking, light can be expressed as a combination of three interconnected parameters, i.e., by colors of three-color components, which are known as base colors. Each of these base colors can be the one that cannot be reproduced by mixing two others. There are a great variety of three basic colors that can reproduce the entire range of the color spectrum. Among those, three basic colors, i.e., red (R), green (G), and blue (B) form the most popular system known as an RGB system. By mixing the RGB colors we can produce practically any color shade of a visible color. The principle of RGB color mixing system find wide practical application in color TV, flat panel displays, color printing, etc.

There are known various color definition and classification systems. These systems define various colors and standardize them. In 1931, the International Commission on Illumination has standardized the following wavelengths for the RGB color mixing system: 700 nm for R, 546.1 for G, and 435.8 for B. Therefore development of new effective color mixing systems still remains an actual problem of the technology.

It is important to notice that, in the aforementioned standards, unit quantities of basic colors are selected so that a ratio of their energetic brightnesses is equal to a predetermined value, i.e., 72.1:1.4:1.0. This ratio, however, will be changed, if we chose, e.g., 653 nm for red, 530 nm for green, and 458 nm for blue.

Heretofore color-mixing systems with electronic control have been known. One of the latest developments in this field is a color image formation system described in U.S. Pat. No. 5,832,155 issued in 1998 to Rasch, et al. This invention concerns an integrated-optical junction splitter, in particular for applications in the wavelength range of visible light, which ensures a spatial and wideband combination of light in a wavelength spectrum $\Delta\lambda$ greater than 75 nm (value given applies to short-wave visible light). The system uses a single white light source or several light sources with a wide wavelength distance. In the case of a usable wavelength range comprising the entire spectrum of visible light, the junction splitter is a white light junction splitter. The aforementioned junction splitter consists of at least three channel waveguides, at least one of which must be a single-mode integrated-optical wideband channel waveguide (SOWCW). Two channel waveguides, with each having a respective input, are combined into a common SOWCW at their outputs in a coupling point, which common SOWCW features a common light output at its end. This wideband junction splitter is used as a wavelength-selective or wavelength-independent switch or modulator, in interferometric and photometric devices, sensors, and microsystem-technical solutions.

The aforementioned U.S. Pat. No. 5,832,155 describes only passive optical waveguide splitting and mixing of various wavelengths in a solid-state waveguide embedded in a solid-state material, such as $LiNbO_3$. No electronic control is mentioned.

The system described in U.S. Pat. No. 5,832,155 has the following disadvantages. The white light junction splitters used in the system are optically and electrically inefficient because only few microwatts of light energy (less than 1% of the entire light energy emitted from the source) can be coupled from the white source. This inefficiency generates heat-removal problems, since the unused energy is converted into heat inside the device. For the same reason, electrical consumption of the system of the aforementioned patent is not suitable for portable devices since a high-capacity power source is needed.

Furthermore, embedding of titanium waveguides into the matrix of $TiNbO_3$, as well as processing of electrodes used in the aforementioned patent, are expensive and complex processes that include photolithography and other complicated operations.

The only light source for all spectral (wavelength) components of the system is a white light source that must be always ON for operation of the system. This means that when modulation signals, i.e., high-voltage pulse signals $U_1$, $U_2$, $U_3$, are sent to the electrodes for adjusting output light powers of individual waveguides, the process consists in "closing" unnecessary waveband portions while passing to the output the selected portions. This means that a major part of light energy is lost, and the system operates with low efficiency.

U.S. Pat. No. 5,802,222 issued in 1998 to the same applicants as U.S. Pat. No. 5,832,155 discloses a color image generation system for the reproduction of real or virtual, two-dimensional or three-dimensional, color, or monochrome image, in particular for television, video, or printing applications. Integrated-optical structures are used on a mount, in particular a substrate. An image is generated by deflecting color light beams generated into a viewing space, which deflection is effected in synchronism with color setting and intensity- or amplitude modulation of the light. The patent does not describe but only shows the electronic control assembly and describes in more detail the color image generation system that may be integrated on a mount either monolithically or in hybrid fashion. The color generation system may be implemented as an encased module.

Similar to U.S. Pat. No. 5,832,155, the system of U.S. Pat. No. 5,802,222 is based on adjusting the light intensity signals of at least two wavelengths which are to be mixed so that the final light intensity signal ratio on the output of the color mixer is obtained in accordance with the value required for a specific color. To achieve this purpose, the inventors use various control means such as amplitude attenuators, amplitude modulators and modulators of other types, pulse duration adjusters, etc. Although the description of the electronic control unit is essential for understanding the operation of the system, no disclosure of electronic control is contained in the description. Nevertheless, it can be assumed that for obtaining a great variety of color shades, such an electronic system, would be very complicated and expensive, since it is based on amplitude modulation of component light power signals prior to their mixing.

Known are various systems for electronic control of intensity of light emitted from a laser diode. Thus, U.S. Pat. No. 5,715,021 issued to Gibeau at al. describes a method and apparatus for a multi-application, laser-array-based image system, which utilizes three linear laser arrays. Each linear array generates multiple (N>1) parallel output beamlets at one of the three primary colors (red, green, blue). The corresponding 1 to N output beamlets of the three linear arrays, each individually modulated in luminance according to a specific encoding scheme representing the video image to be produced on the viewing screen, are combined spatially to form a single white light linear array source. Through a projection/scanner optical system, the N output beamlets of the white light source are simultaneously directed to, and swept horizontally across a distant viewing screen, resulting in a swath of N lines of a graphic video image. By producing M contiguous swaths vertically down the viewing screen, a full image of M×N lines is produced. The red, green, and blue linear laser arrays may consist of arrays of semiconductor laser diodes made of suitable semiconductor materials so as to directly emit radiation at wavelengths corresponding to red, green, and blue colors, respectively. Alternatively, the red, green and blue color arrays may be formed by arrays of semiconductor laser diodes emitting radiation at twice the desired red, green and blue wavelengths, whose radiation is coupled to arrays of second harmonic generation crystal elements.

The device described in the aforementioned patent is complicated in construction since it relates to three color laser arrays, i.e., to arrays of red, green, and blue colors. Furthermore, some components of the optoelectronic circuits used in the system of U.S. Pat. No. 5,715,021, such as the array of blue color, which corresponds to the basis blue of the standard RGB system, are not yet commercially produced. The optical system for collimation and delivery of light beamlets is also extremely complicated and requires the use of special couplings and optical elements, which also are not yet industrially produced.

OBJECTS OF THE INVENTION

It is an object of the present invention to provide an apparatus for color mixing in a laser diode system which has miniature dimensions and therefore is suitable for use in portable devices, possesses high light power efficiency, is free of heat-generation problems, has low electrical consumption, has simple construction and is inexpensive to manufacture, ensures modulation of wavelength signals directly on a laser-diode light source, and ensures mixing of a great number of different colors and color shades with adjustment of output color tones. Another object is to provide a new method of color mixing in a laser diode optical system for obtaining a great variety of colors and color. Another object of the invention is to provide aforementioned apparatus and method, which, in view of their versatility, are suitable for application in different fields from mere color mixing to high-definition TV sets.

SUMMARY OF THE INVENTION

A color mixing system is proposed for use in an optical-fiber laser-diode assembly comprising at least two semiconductor laser diodes, optical fiber light input and output couples, a system of spatial superposition of laser beams of different wavelength with at least one semi-transparent mirror, and a system for electronic control of light power in monochromatic light components to be mixed. The electronic control system makes it possible to produce a plurality of different colors. The basic colors, i.e., blue, green, and red, are produced by respective laser diode assemblies provided with means for adjusting output light power on each individual assembly. The electronic system contains a microprocessor connected to a pulse width modulation unit capable of modulating the duration of the light pulse emitted from the laser diode for controlling chromaticity of the color and to a current source for controlling the luminescence, i.e., the light power. The aforementioned control of chromaticity and light power is carried out simultaneously in real time with reproduction of perfect colors based on the use of single-mode pure stabilized and frequency-doubled wavelengths with narrow linewidths of the light spectra.

DETAILED DESCRIPTION OF THE INVENTION

Figure 1:
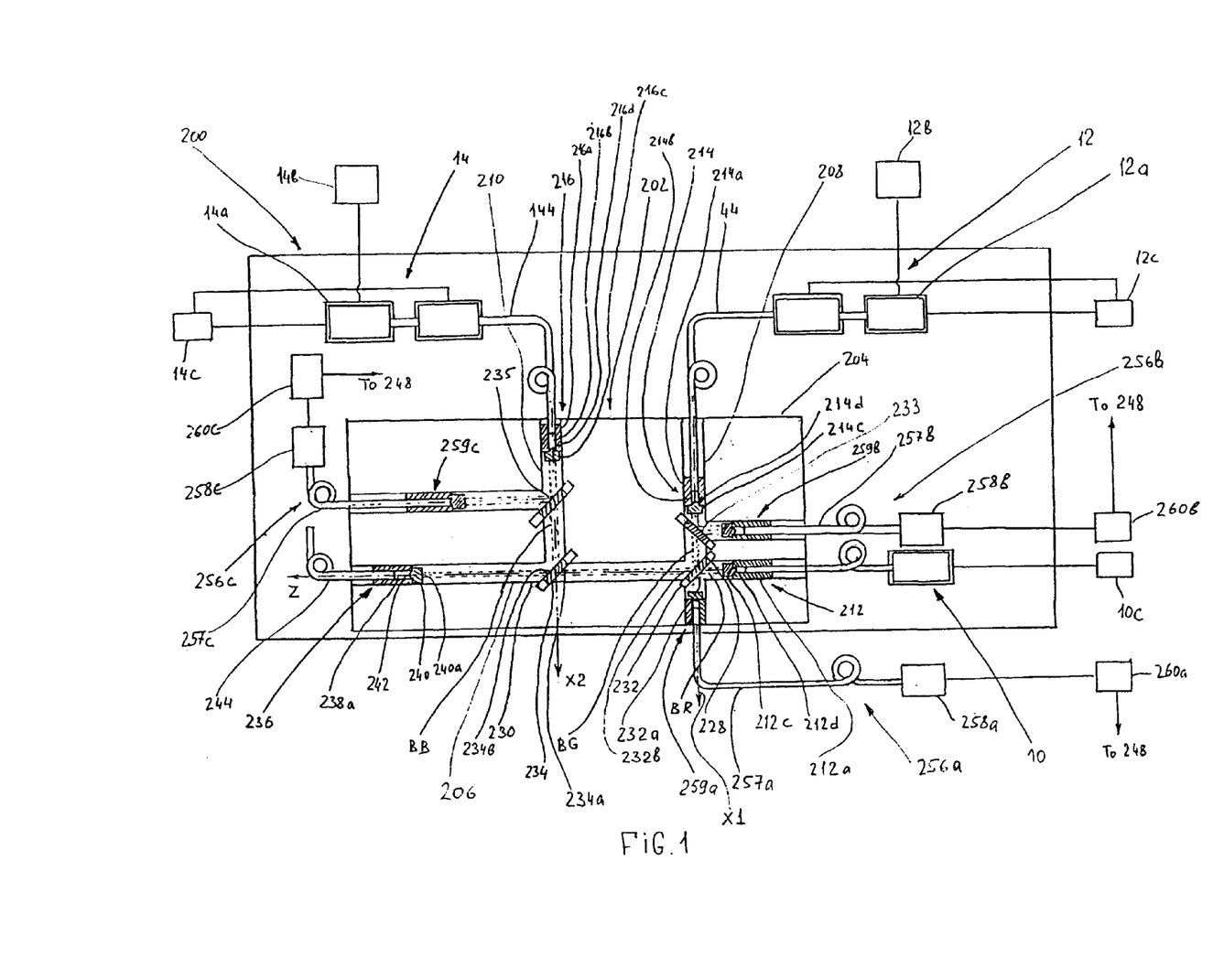
FIG. 1 is a top view of the apparatus of the invention, which shows layout of the components of the optical system.
Figure 2:
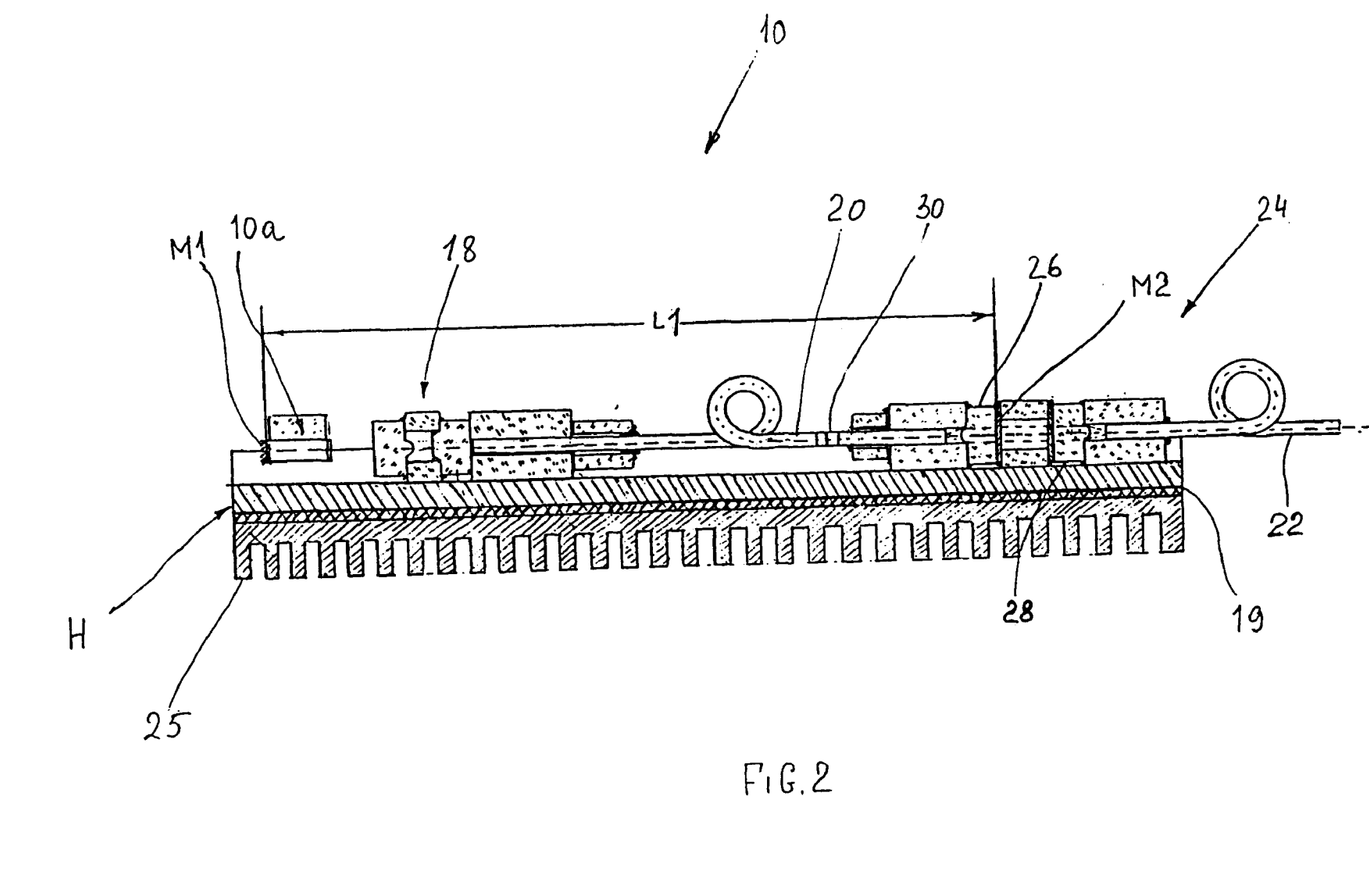
FIG. 2 is a longitudinal sectional view of a semiconductor laser diode assembly for generating red light in the apparatus of the invention.
Figure 3:
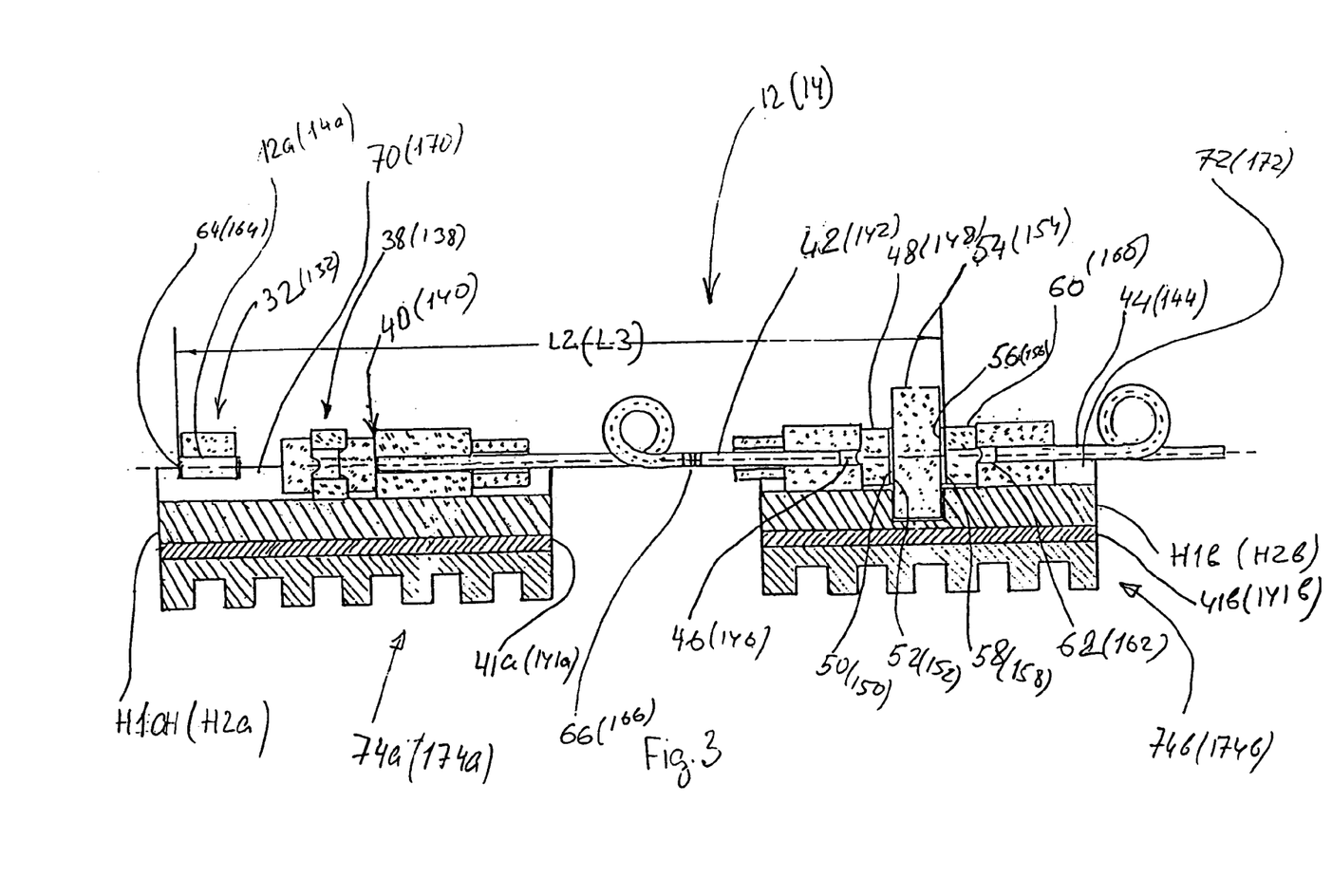
FIG. 3 is a longitudinal sectional view of a semiconductor laser diode assembly for generating green and blue lights in the apparatus of the invention.

FIGS. 1–3—Structure and Operation of the Optical System

An optical color-mixing system of the present invention is shown schematically in FIG. 1, which shows three optical fiber assemblies that generate component lights of three basic RGB colors and a system of beam superposition on a common output coupler.

As shown in FIG. 1, the system has three semiconductor laser diode assemblies 10, 12, and 14, which correspond to R, G, and B of the RGB system, respectively. Each assembly contains a semiconductor laser (10a, 12a, and 14a) that generates a light signal of an appropriate wavelength corresponding to R, G, and B, appropriate power supply unit (10b, 12b, and 14b), respectively, as well as temperature control means, which is described below.

An example of a semiconductor laser diode assembly 10 suitable for generating red light in the system of the invention is shown in FIG. 2. Such laser diode assembly is described in U.S. patent application Ser. No. 09/658,619 filed by the same applicant on Sep. 8, 2000.

As shown in FIG. 2, a laser-diode assembly 10 for generating a frequency-stabilized narrow-bandwidth light comprises a light source in the form of a semiconductor laser diode 10a coupled via a first optical coupling device 18 to one end of a first optical fiber 20. The other end of this fiber is coupled to a second or an output fiber 22 via a second optical coupling device 24. The assembly is characterized by the fact that a long inner laser cavity L1 is formed by a section of the optical system between two oppositely directed mirror coatings M1 and M2. The first mirror coating M1 is applied onto the back side of the semiconductor laser diode 10a, and the second mirror coating M2 is applied, e.g., onto a flat front side of an optical lens element 26 or onto the back side of another optical lens element 28 included into the laser-diode assembly 10. These optical lens elements 26 and 28 are parts of an optical coupling between the first and the second fibers 20 and 22, respectively. The first mirror coating M1 completely reflects the entire light incident onto this mirror coating, whereas the second mirror coating M2 reflects a major part of the light, e.g., about 90% and passes only a small part, e.g., 10% of the light incident onto this mirror. The Bragg grating 30, written in the fiber 20, is designed so that, in combination with the laser cavity L1, it suppresses the side modes of the wavelength bands and transforms them into the central mode of the narrow wavelength band, which can be passed through this grating. The light processed by the Bragg grating is passed through the second mirror coating M2 to the output fiber 22, while the reflected light performs multiple cycles of reflection between both mirrors M1 and M2 which thus form a laser resonator which amplifies the laser light output at the selected narrow waveband.

The laser diode assembly 10 has a housing H with a central longitudinal groove that is used for mounting and aligning optical components of the assembly, i.e., the laser diode 10a, the couplers 18, 24, etc. The housing H is used for stabilization of temperature of the optical components and is connected to a temperature control means that consists of an electrically controlled cooling device 19 (FIG. 2), such as a Peltier-type device, and an electronic temperature control unit 10c (FIG. 1). In FIG. 1, the electronic temperature control unit 10c is shown conventionally as a separate block. Reference numeral 25 in FIG. 2 designates a heat-removing radiator.

Although the laser diode assembly 10 is used in the system of FIG. 1 specificaly for generating the basic red-light component of 700 nm that corresponds to the standard of the International Commission on Illumination, it is understood that the above-described construction can be realized for a basic color of another three basic component color system.

Laser diode assemblies 12 and 14, which are intended for generating G and B components of the RGB system used in the present invention, have identical constructions and differ only by the types of laser diodes that generate light of 1092.4 nm for G, and 871.6 for B. The non-linear crystals will double the frequencies and thus produce on the output fibers wavelengths of 546.1 nm and 435.8 nm. For example, a laser diode assembly produced in a laboratory could generate 458 nm for blue by doubling 916 nm, 530 nm for green by doubling 1060 nm, and by using 635 nm as it is for red.

The construction of laser diode assemblies 12 and 14 for generation of green and blue lights is shown in FIG. 3 and is described in more detail in U.S. patent application Ser. No. 09/698,619 by the same applicant on Sep. 8, 2000. FIG. 3 illustrates only one of the assemblies 12 and 14 which are structurally identical for both green and blue light generation assemblies and differ from each other only by characteristics of some components such as laser diodes, non-linear crystals, Bragg gratings, etc. Therefore, the description of the green/blue light-generation assemblies will be common for both assemblies, wherein the components of the green-light assembly will be shown without parentheses, while the components of the blue-light assembly will be shown in parentheses.

It can be seen from FIG. 3 that the assembly consists of a light source 32 (132) in the form of a semiconductor injection laser, which is coupled via an anamorphotic objective 38 (138) and via a butt-connection unit 40 (140) directly to an optical fiber 42 (142). The other end of this fiber is coupled to the output optical fiber 44 (144) via an air gap 46 (146), a first circular aspherical lens element 48 (148), a first dichroic coating 50 (150) on the back side of the lens element 48 (148), a layer of a UV-curable glue 52 (152), a non-linear crystal 54 (154), a layer of a UV-curable glue 56 (156), a second dichroic coating 58 (158), a second microlens element 60 (160), and an air gap 62 (162). The aforementioned dichroic coatings 50 (150) and 58 (158) located on both sides of the non-linear crystal 54 (154) are oppositely directed dichroic coatings of high reflectivity for lights of different wavelengths. The back facet of the semiconductor laser 32 (132) has a high-reflectivity coating 64 (164) for reflecting the fundamental wavelength. The section of the fiber 42 (142) with other appropriate components between the aforementioned high-reflectivity coating 64 (164) and the last dichroic coating 58 (158) in the direction of light propagation forms the so-called laser cavity L2 (L3), which contains a Bragg grating 66 (166). This grating selects a desired mode of the fundamental wavelength from the possible modes of the spectral range. By using different orientations of the non-linear crystal, it is possible to double, triple, or quadruple the wavelengths, and by replacing the crystals, it is possible to obtain lights of different colors. Such a construction makes it possible to form a very compact and efficient frequency-multiplied laser diode.

In the system of the present invention shown in FIG. 3 the assemblies 12 and 14 produce on the output optical fibers 44 and 144 green (G) and blue (B) lights of RGB system, respectively. More specifically, the semiconductor laser diodes 32 and 132 of assemblies 12 and 14, respectively, are selected so that the light produced on the output of optical fiber 44 has a wavelength of 530 nm, and the light produced on the output of optical fiber 144 has a wavelength of 458 nm.

The laser diode assembly 12 (14) has a housing which consists of two parts H1a (H1b) and H2a (H2b) with central longitudinal grooves 70 (170) and 72 (172) that are used for mounting and aligning optical components of the assembly, i.e., the laser diode 32 (132), the objectives 38 (138), etc. The housing parts H1a (H1b) and H2a (H2b) are used for stabilization of temperature of the optical components and are connected to electrically controlled cooling devices 41a (141a) and 41b (141b), such as Peltier-type devices, and an electronic temperature control units 12c (14c). In FIG. 1, the electronic temperature control units 12c and 14c are shown conventionally as separate blocks. In FIG. 3 reference numeral 74a (174a) and 74b (174b) designate heat-removing radiators.

As shown in FIG. 1, the aforementioned laser diode assemblies 10, 12, and 14 are mounted on a common support or plate 200, which also supports a color combining assembly 202. This assembly includes a mounting plate 204 made of glass, quartz, ceramic, or another material with a low coefficient of thermal expansion. The mounting plate 204 has a longitudinal groove 206 of a rectangular cross section and two transverse grooves 208 and 210, which are perpendicular to the groove 206 and are parallel to each other. The transverse grooves 208 and 210 also have a rectangular cross section. All three grooves 206, 208, and 210 serve for precisely positioning respective beam collimating units 212, 214, and 216 for the formation of diffractionally-limited collimated red, green, and blue beams BR, BG, and BB. Respective units 212, 214, and 216 consist of ferrules 212a, 214a, and 216a aligned and centered in the aforementioned grooves 206, 208, and 210, ends of the output fibers 22, 44, and 144 (FIGS. 1, 2, and 3) inserted into the central openings 212b, 214b, and 216b of respective ferrules 212a, 214a, and 216a, and microlens elements 212c, 214c, and 226c with microlenses 212d, 214d, and 226d inserted into the openings 212b, 214b, and 216b from the opposite sides of the ferrules 212a, 214a, and 216a. The end faces of output fibers 22, 44, and 144 have to be located at strict distances from the respective microlenses 212d, 214d, and 226d so as to form the aforementioned diffractionally-limited collimated laser beams BR, BG, and BB.

Self-alignment of respective beam collimating units 212, 214, and 216 is achieved due to precise cross-sectional dimensions of the grooves, accurate dimensions of the ferrules, and accurate mutual (parallel or perpendicular) positions of the grooves. More specifically, the diameters of the ferrules 212a, 214a, and 216a ensure precise sliding fit of the ferrules into the grooves, and the heights of the grooves are equal to the outer radii of the ferrules.

In FIG. 1, symbol Z designates an optical axis of the beam collimating unit 212 which coincides with the longitudinal axis of the groove 206, i.e., with the direction of propagation of light from the output optical fiber 22 of the laser diode 10, and symbols X1 and X2 designate optical axes of the beam collimating units 214 and 216 which coincide with the longitudinal axes of the grooves 208 and 210, i.e., with the directions of propagation of light from the output optical fibers of the laser diodes 12 and 14, respectively. It is understood that the optical axes X, Y, and Z lie in the plane of the upper surface of the plate 202.

Grooves 228 and 230, which are arranged at an angle of 45° to the axis Z, are cut in the plate 202 at points of intersection of the axes X1 and X2 with the axis Z. Inserted into these grooves 228 and 230 are semitransparent mirror plates 232 and 234, respectively. The mirror plate 232 has a coating 232a on the side that faces the beam-collimating unit 212 and a coating 232b on the opposite side of the plate. At the same time, these coatings reflect a small amount, e.g., 3% of the light power of the beam BR, towards a feedback circuit 256a, which is connected via a photodiode 258a and an analog/digital converter 260a to a microprocessor 248, described later in connection with the description of the electronic control system. As will be described later, this feedback is used for controlling the luminescent characteristics, i.e., the light power of the beam emitted from the laser diode assembly 10. At the same time, the coatings 232a and 232b ensure maximum possible reflection of the green light of 546.1 nm emitted from the laser diode assembly 12 with minimal losses.

An additional partially-transparent mirror 233 is installed in the optical path of the green beam BG from the output optical fiber 44 toward the mirror 232. The mirror 233 passes the beam BG, but reflects a small amount, e.g., 3% of the light power, towards a feedback circuit 256b, which is connected via a photodiode 258b and an analog/digital (A/D) converter 260b to the aforementioned microprocessor 248. As will be described later, this feedback is used for controlling the luminescent characteristics, i.e., the light power of the beam emitted from the laser diode assembly 12.

The mirror plate 234 has a coating 234a on the side that faces the beam-collimating unit 212 and a coating 234b on the opposite side of the plate 234. In combination with coatings 234a and 234b, the coatings 232a and 232b ensure passage of red light of 700 nm from the laser beam assembly 10 in the direction of the axis Z with minimal losses.

An additional partially transparent mirror 235 is installed in the optical path of the blue beam BB from the output optical fiber 144 toward the mirror 234. The mirror 235 passes the beam BB, but reflects a small amount, e.g., 3% of the light power, towards a feedback circuit 256c, which is connected via a photodiode 258c and an analog/digital (A/D) converter 260c to the aforementioned microprocessor 248. As will be described later, this feedback is used for controlling the luminescent characteristics, i.e., the light power of the beam emitted from the laser diode assembly 14.

In combination, the coatings 234a and 234b ensure passage of the red light beam that has passed through the semitransparent mirror plate 232 and the green light beam reflected from the coating 232b of the plate 232. At the same time, the coating 234b ensures maximum possible reflection of the blue light of 435.8 nm emitted from the laser diode assembly 14 with minimal losses.

Thus, downstream of the semitransparent mirror plate 234, a three-component beam BR—BG—BB consisting of beams BR, BG, and BB propagates in the direction of axis Z. Installed on the way of the three-component beam BR—BG—BB is a common output coupler 236 which consists of a self-aligned ferrule 238 positioned in the groove 206 and having a through opening 238a, a microlens element 240 with a microlens 242 inserted into one end of the opening 238a, and a common output fiber 244 of the entire system which is inserted into the opening 238a from the other side of the ferrule 238.

In order to provide the maximum intensity of the green and blue beams BG and BB for matching with the intensity of the red beam BR, the distances from respective beam collimating units 212, 214, and 216 to the flat back side 240a of the microlens element 240 should be substantially equal. The fine adjustment of the light beam intensities is performed only once during assembling of the system by micropositioning the respective beam collimating units with reference to the maximum output light signal separately for each wavelength and then fixing the units in the adjusted positions, e.g., by glue.

As has been mentioned above, for controlling luminescent properties, i.e., the light power, in each laser diode assembly 10, 12, and 14, a portion of light energy, e.g., about 3%, is extracted from the main beam and is sent via respective feedback circuits 256a, 256b, and 256c (FIG. 1) to a microprocessor 248.

It should be noted that the units for coupling the beams reflected from the respective mirrors 232, 233, and 235 to the feedback fibers 257a, 257b, and 257c between the respective mirrors and the photodiodes 258a, 258b, and 258c are performed through the use of couplings 259a, 259b, and 259c. These couplings are identical to beam collimating units 212, 214, and 216 shown in FIG. 1. Furthermore, matching of the photodiodes 258a, 258b, and 258c, which received the feedback signals from the reflecting mirrors 232, 233, and 235, with the feedback fibers 257a, 257b, and 257c is carried out with the use of the same ferrules and lenses as those shown in connection with the beam collimating units 212, 214, and 216. Thus, the same standard fiber/fiber or fiber/optical component unit is used for assembling the optical system. This simplifies assembling and reduces the cost of the system.

Figure 4:
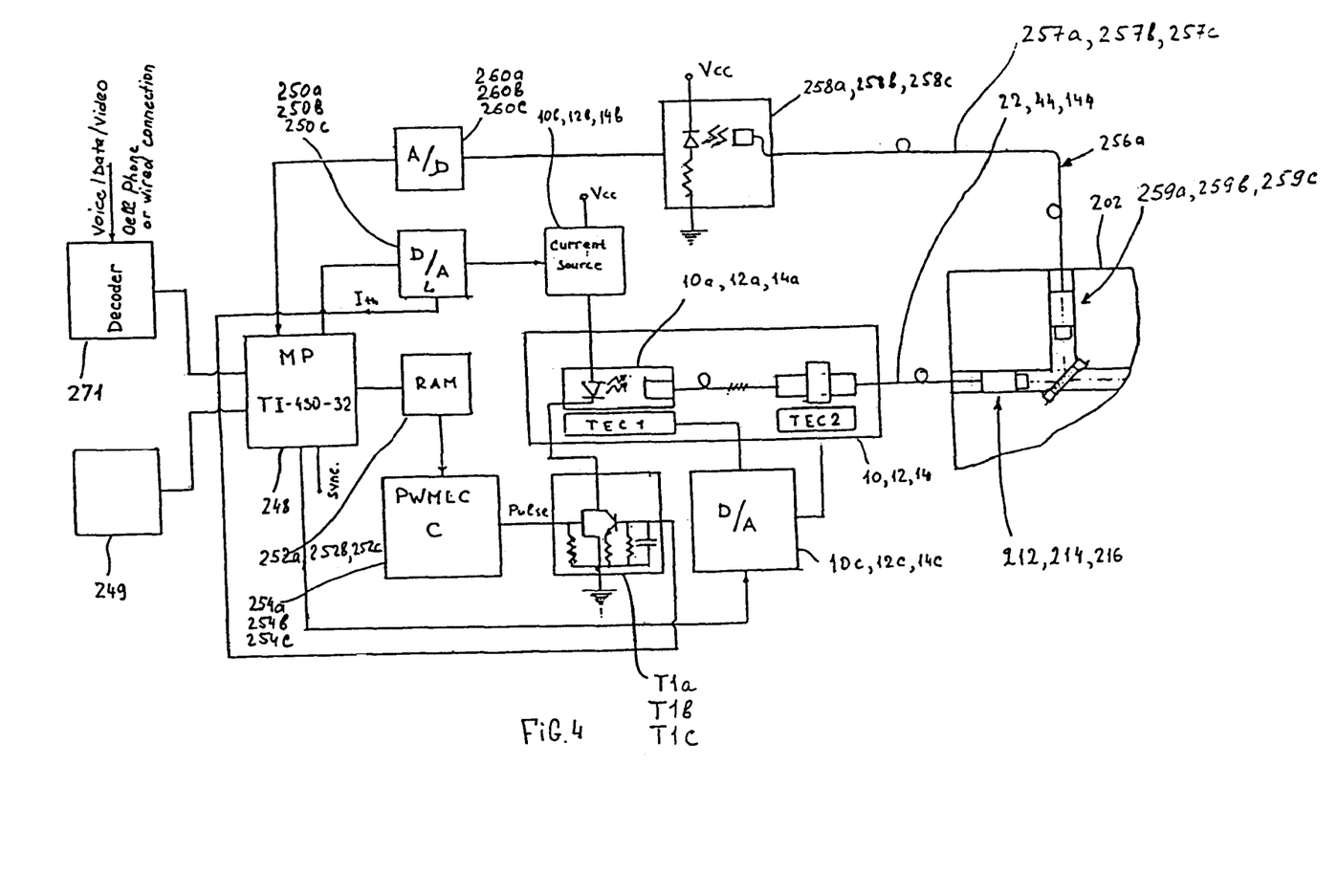
FIG. 4 is a block diagram of an electronic circuit for setting up and controlling intensity of light in one of monochromatic optical units shown in FIGS. 1, 2, and 3.

FIG. 4—Structure and Operation of the Electronic Control System

FIG. 4 is a block diagram of an electronic circuit for setting up and controlling intensity and chromaticity of light in one of monochromatic optical units shown in FIGS. 1, 2, and 3. It is understood that three such units are incorporated into the general system of FIG. 1. Since, in principle, the set up and control of the light intensity and chromaticity in any of the aforementioned units is identical, the diagram of FIG. 4 will be considered as a generalized circuit for all three component colors.

In the diagram of FIG. 4, reference numerals 10, 12,14 designate laser diode assemblies shown in FIGS. 1, 2, and 3. The input current which controls operation of the diodes 10$a$ (12$a$, 14$a$) of the assemblies 10, 12,14 is supplied to each of them from their respective power supply unit 10$b$ or 12$b$ or 14$b$ (FIGS. 1 and 4), which, in turn, is controlled from a microprocessor 248 via a digital/analog (D/A) converter 250. The microprocessor 248 is common for all three monochromatic systems. The subsequent description will be in singular, as it is common for each laser diode assembly. Examples of the microprocessor 248 suitable for the purposes of the present invention are TI-430-32, TI-430-33, and TI-430-34 units produced by Texas Instrument Co., USA.

The microprocessor 248 is connected to a programming device, such as a computer 249 (also common for all three assemblies), and is connected in serial to respective microprocessors with an auxiliary 8-bit output which interfaces with a high speed 8-bit pulse-width modulating logic circuits (PWMLC) 254$a$, 54$b$, 254$c$ which determine chromaticity of the colors based on duration of light pulses generated by laser diodes 10$a$, 12$a$, 14$a$. For this purpose, the PWMLC 254$a$, 254$b$, 254$c$ are connected to the laser diodes for controlling the pulse duration by turning transistor circuits T1$a$, T1$b$, T1$c$ of the laser diodes ON on a rising edge of the pulse and OFF on the falling edge of the pulse. The function of these transistor circuits can be fulfilled by commercially produced laser diode drivers 10$b$, 12$b$, 14$b$ suitable for use in conjunction with laser diodes for causing them to operate in a pulse mode. Thus, the microprocessors 252$a$, 252$b$, 252$c$ in combination with the 8-bit PWMLC 254$a$, 254$b$, 254$c$ makes it possible to obtain $2^8$ (i.e., 256) combinations of light intensity gradations in light emitted from each laser assembly via their respective output optical fibers 22, 44, and 144 (FIG. 1).

Levels of currents in the laser diodes 10$a$, 12$a$, and 14$a$ are controlled by means of appropriate power supply units, such as current sources 10$b$, 12$b$, and 14$b$ (FIG. 4) for controlling the output optical signals of beams BR, BG, and BB (FIG. 1) so that they correspond, e.g., to the aforementioned 72.1:1.4:1.0 ratio. The outputs of these current sources are connected to respective laser diodes 10$a$, 12$a$, and 14$a$, while their inputs are connected to the microprocessor 248 via respective digital/analog (D/A) converters 250$a$, 250$b$, 250$c$. In each respective laser-diode assembly, the current source (10$b$, 12$b$, and 14$b$) determines the luminescent characteristics or light power.

As has been shown above with reference to FIG. 1, each laser diode assembly 10, 12, and 14 is connected to the microprocessor 248 via the feedback circuit 256$a$, 256$b$, 256$c$ which contain a photodiodes 258$a$, 258$b$, and 258$c$ and the 12-bit A/D converters 260$a$, 260$b$, 260$c$ connected in series in the optical fibers 257$a$, 257$b$, 257$c$.

The microprocessor 248 is also connected to the aforementioned electronic temperature control unit 10$c$ or 12$c$ or 14$c$ (FIG. 1) of its respective laser assembly. It should be noted that separate electronic temperature control units should be used for each housing part H1$a$ (H2$a$) and H1$b$ (H2$b$) in the laser assembles of the blue and green lights shown in FIG. 3. A single electronic temperature control unit will be used for the red laser diode assembly.

Reference numeral 271 (FIG. 4) designates a decoder unit which is common for all the laser diode assemblies and which makes it possible to adjust luminescent properties and chromaticity from voice commands, digital commands, etc., e.g., via a cellular phone or the like.

The electronic control system of the apparatus of the invention operates as follows:

After the manufacturing of the apparatus of the invention shown in FIGS. 1–4 is completed, it is subjected to initial set-up at the manufacturer's facility. When the apparatus is turned on for this set up, the microprocessor 248 begins to operate in a self-diagnostic mode in which it checks all the parameters of the system, performs functional tests, and compares the measured parameters with those of the last set-up data. The aforementioned set up parameters include a temperature set points for the laser diode (10$a$, 12$a$, and 14$a$) and the non-linear crystal (54, 154). This self-diagnostic procedure is fulfilled under control of the computer 249.

Next step is to set up a standard color in each laser diode assembly so that a ratio of energetic brightnesses of the component beams corresponds to 72.1:1.4:1.0. This is achieved by selecting levels of currents in appropriate power supply units 10$b$, 12$b$, and 14$b$ (FIG. 4) for controlling the output optical signals of beams BR, BG, and BB (FIG. 1) so that they correspond to the aforementioned 72.1:1.4:1.0 ratio. At this stage the initial set up of the system is completed. It is understood that the 72.1:1.4:1.0 ratio is given only as an example which is in compliance with recommendations of the International Commission on Illumination and that any other ratio can be chosen. For example, in a laboratory model the laser assemblies generated beams of 635 nm, 530 nm, and 458 nm, which are different from those mentioned above.

Once the system is calibrated to the selected color ratio standard, the optical power level is permanently set in the microprocessor 248 of each color system. With the aging of the system, the aforementioned initial setup is periodically adjusted by the microprocessor 248 in order to provide colors per selected standards.

The performance of the optical energy is periodically compared to the pre-set values in the microprocessor 248, and the power levels in 10$c$, 12$c$, and 14$c$ is automatically adjusted.

The operation of all three-laser diode assemblies 10, 12, and 14 (FIG. 1) will mix the beams BR, BG, and BB of the component standard basic colors and will produce a white beam WB (FIG. 1) in the general output optical fiber 244.

It is understood that for obtaining any selected color shades, it is necessary to adjust levels of output optical signals in the output optical fibers 22, 44, and 144 (FIG. 1) in predetermined proportions. The levels of the output optical signals in the output optical fibers 22, 44, and 144 are proportional to the level of current amplitude as controlled through optical feedbacks 258$a$, 258$b$, 258$c$, the A/D converters 260$a$, 260$b$, 260$c$, the microprocessor 248, the D/A converters 250$a$, 250$b$, 250$c$, and the current sources (10$c$, 12$c$, 14$c$), The level of the mean current can be regulated via the PWMLC 254$a$, 354$b$, 254$c$. For this purpose, a command is sent from the computer 249 to the microprocessor 248, and the latter, in turn, sends a command via the auxiliary microprocessors 252$a$, 252$b$, 252$c$ with an 8-bit output to the PWMLC 254$a$, 254$b$, 254$c$. The PWMLC 254$a$, 254$b$, 254$c$ control the width of the current pulses in the laser diodes 10$a$, 12$a$, and 14$a$, thus defining the laser light power at the output of the laser diodes Once the levels of currents in the individual laser diodes 10$a$, 12$a$, and 14 are adjusted, maintaining of these levels is ensured through the feedback circuits 256a, 256b, 256c. For this purpose, a feedback signal with an intensity of about 1% of the total optical power is sent from the output optical fibers 22, 44, 144 via the photodiodes 258a, 258b, 258c and the 12-bit analog/digital (A/D) converters 260a, 260b, 260c to the microprocessor 248, where the feedback signal is compared with the initial setting. In the case of disagreement, the microprocessor 248 will adjust the level of the current in the appropriate laser diode via the microprocessors 252a, 252b, 252c and the 8 PWMLC 254a, 254b, 254c in a manner described above.

If necessary, the chromaticity and luminescent properties of the system can be adjusted via the decoder unit 271 by means of a voice command, digital command, etc., e.g., via a cellular phone or the like.

It can be seen that the correction of the current level via the feedback circuit 256 occurs in the position prior to the mixing portion of the circuit in direction of propagation of the light. Therefore the current correction procedure can be performed at any time during operation of the system without interruption of the operation. If necessary, this procedure can be automated.

Since the main components of the apparatus of the invention are based on microoptical elements interconnected through optical fibers, the overall dimensions of the entire apparatus of the invention can be reduced to miniature dimensions.

For the example, the entire optical and electrical system may have overall dimensions, which allow to built this system into any portable device.

Thus, it has been shown that the invention provides an apparatus for combining monochromatic color beams in a laser diode system which has miniature dimensions and therefore is suitable for use in portable devices, possesses high light power efficiency, is free of heat-generation problems, has low electrical consumption, has simple construction and is inexpensive to manufacture, ensures modulation of wavelength signals directly on a laser-diode light source, ensures mixing of a great number of different colors and color shades with adjustment of output color tones. The invention also provides a new method of color mixing in a laser diode optical system for obtaining a great variety of colors and color shades adjustable in a stepless manner.

Although the invention has been shown and described with reference to specific embodiments, it is understood that these embodiments were given only for illustrative purposes and that any changes and modifications with regard to shapes, designs, materials, and combinations thereof are possible, provided these changes and modifications do not depart from the scope of the patent claims. For example, the set-up procedure described in the specification is not necessarily performed for obtaining of only basic colors but can also be used for changing the intensities of the basic color beams and thus for obtaining different shades of the output colors. The microprocessor can be common or all three-color systems. The microprocessor is not necessarily an 8-bit processor and can be a 64-bit or any other processor. The color ratio may be selected in accordance with any other standard. Laser diode current modulation can be carried out in accordance with any waveform such as square, sinusoidal, etc. Laser diode current modulation and pulse width modulation can be performed simultaneously for optimum color mixing and for electrical power consumption from the battery of a portable system.

What is claimed is:

1. A method of color mixing in a laser diode system comprising the steps of: generating laser beams of at least two different wavelengths by at least two single mode laser diode assemblies; supplying the laser beams of at least two different wavelengths into two single mode fibers so that a laser beam of one of said at least two wavelengths is supplied into corresponding one of said single mode fibers; combining the laser beams of different wavelengths outputting from said at least two single mode fibers into at least one laser beam; supplying said at least one laser beam into a further single mode fiber; controlling each of said at least two single fiber laser diode assemblies by an electronic control system having ratio control means for controlling a ratio of energetic brightnesses of said laser beams; selecting said ratio in compliance predetermined value; energizing said laser diode assemblies for emitting said laser beams of at least two different wavelengths toward said laser beam combining means; adjusting said ratio to said predetermined value with the use of said means for controlling a ratio of energetic brightnesses to form adjusted laser beams.

2. The method of claim 1, further comprising the step of providing said electronic control system with temperature control means and controlling the temperature individually in each of said laser diode assemblies with the use of said temperature control means.

3. The method of claim 1, further comprising the step of providing said apparatus with a feedback circuit from said ratio control means to said electronic control system, and constantly maintaining said ratio at said value by sending a signal from said ratio control means to said electronic control system via said feedback control circuit.

4. The method of claim 1, wherein each said laser diode assembly comprises a laser diode and a pulse-width modulating means between said laser diode and said electronic control system, said laser diode generating a light signal, and said step of adjusting said ratio being carries out by adjusting the shape and duration of said signal.

5. A method of color mixing in a laser diode system comprising the steps of: generating laser beams of three different colors which are a red laser beam, green laser beam, and blue laser beam, respectively by three single mode laser diode assemblies; supplying outputs of said single mode laser diode assemblies to three single mode fibers so that the output of each of said three single mode laser diode assemblies is supplied into respective one of said single mode fibers; combining the laser beams of different colors outputting from said single mode fibers into a combined laser beam; supplying said combined laser beam to a further single mode fiber; controlling each of said laser diode assemblies by an electronic control system having ratio control means for controlling a ratio of energetic brightnesses of said laser beams; selecting said ratio in compliance with a predetermined standard; energizing said laser diode assemblies for emitting said laser beams of three different colors toward said laser beam combining means; adjusting said ratio to said standard value with the use of said means for controlling a ratio of energetic brightnesses to form adjusted laser beams.

6. The method of claim 5, wherein said red laser beam has a wavelength of 700 nm, said green laser beam has a wavelength of 546.1 nm, and said blue laser beam has a wavelengths of 435.8 nm, said ratio of energetic brightnesses of said red, green, and blue being equal to 72.1:1.4:1.0.

7. The method of claim 6, further comprising the step of providing said electronic control system with temperature control means and controlling the temperature individually in each of said laser diode assemblies with the use of said temperature control means.

8. The method of claim 5, further comprising the step of providing said apparatus with a feedback circuit for feedback from said ratio control means to said electronic control system, and constantly maintaining said ratio at said value by sending a signal from said ratio control means to said electronic control system via said feedback circuit.

9. The method of claim 1, wherein each said laser diode assembly comprises a laser diode and a pulse-width modulating means between said laser diode and said electronic control system, said laser diode generating a laser beam in a pulse mode, and said step of adjusting said ratio being carries out by adjusting the shape and duration of said pulse.

10. An apparatus of color mixing in a laser diode system comprising: a support means; at least two single mode laser diode assemblies installed on said support means and generating laser beams of at least two different wavelengths; at least two single mode fibers arranged so that said laser beams of at least two different labelings are supplied into said at least two single mode fibers so that a laser beam of one of said two different wavelengths is supplied into a corresponding one of said at least two single mode fibers; at least one laser beam combining means installed on said support means and intended for combining said laser beams of different wavelengths outputted from said at least two single mode fibers; a further single mode fiber arranged so that the combined laser beams of different wavelengths is supplied from said at least one laser beam combining means into said further fiber; and an electronic control system for each of said at least two laser diode assemblies having means for controlling a ratio of energetic brightnesses of said laser beams.

11. The apparatus of claim 10, wherein each said laser diode assembly being composed of optical components and comprises:
   a laser diode assembly housing;
   a semiconductor laser diode which is installed on said laser diode assembly housing and radiates a light of a given wavelength band;
   an input optical fiber;
   a laser cavity formed by a part of said optical components and comprising said input optical fiber, and at least a first reflecting mirror essentially with 100% reflection of light, a second reflecting mirror that passes only a selected portion of said light of a predetermined frequency, and a frequency selection means formed in said input optical fiber for selecting a light of a predetermined frequency in said given wavelength band;
   a first coupling means for coupling said semiconductor laser diode to said input optical fiber;
   an output optical fiber; and
   a second coupling means for coupling said input optical fiber to said output optical fiber.

12. The apparatus of claim 11, wherein each said laser diode has a direction of propagation of light, said at least one laser beam combining means comprises a semitransparent mirror plate having a front side and a rear side, said semitransparent plate being arranged at an angle to said direction of propagation of light emitted from one of said laser diodes and at an angle to said direction of propagation of light emitted from another of said at least two laser diodes, one of said at least two laser diodes having said direction of propagation of light directed toward said rear side of said semitransparent mirror plate, and another of said at least two laser diodes having said direction of propagation of light directed toward said front side of said semitransparent mirror plate, said rear side being coated with a first mirror coating which ensures maximum possible passage of the light emitted from said one of said at least two laser diodes, and said front side being coated with a second coating which ensures maximum possible reflection of the light emitted from said another of said at least two laser diodes.

13. The apparatus of claim 12, wherein said frequency selection means is a Bragg grating.

14. The apparatus of claim 13, wherein said electronic control system further comprises a microprocessor and a feedback circuit between said output optical fiber and said microprocessor for sending a light signal from said output optical fiber to said microprocessor, said microprocessor being connected to said ratio control means for constantly maintaining said ratio at a selected value in response to said light signal.

15. The apparatus of claim 14, wherein said feedback circuit comprises a photodiode and an analog/digital converter connected in series in said feedback circuit.

16. The apparatus of claim 14, wherein said laser diode has switching means for operating said laser diode in a pulse mode for generating pulsed light signals, said ratio control means comprises:
   a digital/analog converter and a power supply unit that are connected in series between said microprocessor and said laser diode;
   a pulse width modulation unit connected to said laser diode via said switching means for controlling duration of said pulse and thus the level of optical power of light generated by said laser diode.

17. The apparatus of claim 14, wherein said laser diode assembly has a temperature control means connected to said microprocessor, and said housing has cooling means connected to said temperature control means.

18. An apparatus of color mixing in a laser diode system comprising: a support means; three single mode laser diode assemblies installed on said support means and generating laser beams of three different colors; three single mode fibers arranged so that said laser beams of three different colors are supplied into said three single mode fibers individually so that one of said laser beams is supplied into a corresponding one of said single mode fibers; a first laser beam combining means installed on said support means and intended for combining two of said laser beams of three different colors outputted from two of said three single mode fibers for forming a two-component beam; a second laser beam combining means installed on said support means and intended for combining the third one of said three laser beams outputted from the third one of said single mode fibers with said two-component beam outputting from said first laser beam combining means a further single mode fiber receiving a three-component beam from said second laser beam combining means; and an electronic controls system for each of said three laser diode assemblies having means for controlling a ratio of energetic brightness of said laser beams.

19. The apparatus of claim 18, wherein each said laser diode assembly being composed of optical components and comprises:
   a laser diode assembly housing;
   a semiconductor laser diode which is installed on said laser diode assembly housing and radiates a light of a given wavelength band;
   an input optical fiber;
   a laser cavity formed by a part of said optical components and comprising said input optical fiber, and at least a first reflecting mirror essentially with 100% reflection of light, a second reflecting mirror that passes only a selected portion of said light of a predetermined frequency, and a frequency selection means formed in said input optical fiber for selecting a light of a predetermined frequency in said given wavelength band;

a first coupling means for coupling said semiconductor laser diode to said input optical fiber;

an output optical fiber; and a second coupling means for coupling said input optical fiber to said output optical fiber.

20. The apparatus of claim 19, wherein each said laser diode has a direction of propagation of light, each said laser beam combining means comprises a semitransparent mirror plate having a front side and a rear side, said semitransparent plate being arranged at an angle to said direction of propagation of light emitted from one of said laser diodes and at an angle to said direction of propagation of light emitted from two other of said three laser diodes, one of said at least two laser diodes having said direction of propagation of light directed toward said rear sides of said semitransparent mirror plates, a second of said three laser diodes having said direction of propagation of light directed toward said front side of said first laser beam combining means, and a third of said three laser diodes having said direction of propagation of light directed toward said front side of said second laser beam combining means, said rear side of each of said semitransparent mirror plates being coated with a first mirror coating which ensures maximum possible passage of the light incident onto said rear side, and said front side of each of said semitransparent mirror plates being coated with a second coating which ensures maximum possible reflection of the light incident onto said front side.

21. The apparatus of claim 19, wherein said electronic control system further comprises a microprocessor and a feedback circuit between said output optical fiber and said microprocessor for sending a light signal from said output optical fiber to said microprocessor, said microprocessor being connected to said ratio control means for constantly maintaining said ratio at a selected value in response to said light signal.

22. The apparatus of claim 21, wherein said feedback circuit comprises a photodiode and an analog/digital converter connected in series in said feedback circuit.

23. The apparatus of claim 21, wherein said laser diode has switching means for operating said laser diode in a pulse mode for generating pulsed light signals, said ratio control means comprises:

a digital/analog converter and a power supply unit that are connected in series between said microprocessor and said laser diode;

a pulse width modulation unit connected to said laser diode via said switching means for controlling duration of said pulse and thus the level of optical power of light generated by said laser diode.

24. The apparatus of claim 21, wherein said laser diode assembly has a temperature control means connected to said microprocessor, and said housing has cooling means connected to said temperature control means.

25. The apparatus of claim 19, wherein said electronic control system further comprises a microprocessor and a feedback circuit between said output optical fiber and said microprocessor for sending a light signal from said output optical fiber to said microprocessor, said microprocessor being connected to said ratio control means for constantly maintaining said ratio at a selected value in response to said light signal.

26. The apparatus of claim 20, wherein said feedback circuit comprises a photodiode and an analog/digital converter connected in series in said feedback circuit.

27. The apparatus of claim 26, wherein said laser diode has switching means for operating said laser diode in a pulse mode for generating pulsed light signals, said ratio control means comprises:

a digital/analog converter and a current control unit that are connected in series between said microprocessor and said laser diode;

a pulse width modulation unit connected to said laser diode via said switching means for controlling duration of said pulse and thus the level of optical power of light generated by said laser diode.

28. The apparatus of claim 27, wherein said laser diode assembly has a temperature control means connected to said microprocessor, and said housing has cooling means connected to said temperature control means.

29. The apparatus of claim 25, wherein said three laser diodes are a red-light laser diode, a green light laser diode, and a blue light laser diode, said housings of said blue and green laser diodes consisting each of two parts, each of said two parts having said temperature control means and said cooling means for individual controlling temperature of said parts.

30. A method of color mixing in a laser diode system comprising the steps of: generating laser beams of at least two different wavelengths by at least two single mode laser diode assemblies; supplying the laser beam to at least two different wavelengths into at least two single mode fibers so that a laser beam of one of said two different wavelengths if supplied into a corresponding one of said single mode fibers; combining the laser beams of different wavelengths outputted from said single mode fibers in a selected ratio; supplying the combined laser beam into further single mode fiber; and controlling by an electronic control system comprising at least current control means current in each of said at least two laser diode assemblies and light pulse modulation width control means for controlling duration of light pulse in each of said at least two laser diode assemblies, each said laser diode assembly having frequency stabilization means and linewidth narrowing means; energizing said laser diode assemblies for emitting said laser beams of at least two different wavelengths toward said laser beam combining means; stabilizing the frequency of the light of a selected wavelength with said frequency stabilization means; narrowing the linewidth of the light spectrum produced by each of said laser beam assemblies; obtaining light beams of colors close to perfect colors in each of said laser beam assemblies by simultaneously controlling light power with the use of said current control means and chromaticity of light with the use of said light pulse modulation control means; and mixing said light beams of colors close to perfect colors with the use of said at least one laser beam combining means.

31. An apparatus of color mixing in a laser diode system comprising: at least two single mode laser diode assemblies that generate laser beams at least two different wavelengths, at least two single mode fibers arranged so that said laser beams of at least two different wavelengths are supplied into said at least two single mode fibers so that a laser beam of one of said two different wavelengths is supplied into corresponding one of said at least two further fibers, at least one laser beam combining means for combining said laser beams of different wavelengths outputted from said at least two single mode fibers; a further single mode fiber arranged so that the combined laser beams of different wavelengths outputted from said at least one laser beam combining means is supplied into said further single mode fiber means for controlling duration of light pulse in each of said at least two laser diode assemblies, each said laser diode assembly having frequency stabilization means and linewidth narrowing means, and an electronic control system comprising at least a current control means for controlling light power in each of said at least two laser diode assemblies, and light pulse modulation width control means for controlling chromaticity of light generated by each of said at least two laser diode assemblies.

* * * * *